United States Patent [19]

Hulstrunk

[11] 4,122,483

[45] Oct. 24, 1978

[54] SEMICONDUCTOR DEVICE HAVING REDUCED LEAKAGE CURRENT

[75] Inventor: William Hulstrunk, Millburn, N.J.

[73] Assignee: RCA Corporation, New York, N.Y.

[21] Appl. No.: 838,168

[22] Filed: Sep. 30, 1977

[51] Int. Cl.² .......................................... H01L 27/12
[52] U.S. Cl. ....................................... 357/49; 357/52;
357/34; 357/53; 357/55; 357/56
[58] Field of Search ...................... 357/49, 52, 53, 55, 357/56, 34

[56] References Cited

U.S. PATENT DOCUMENTS

| | | | |
|---|---|---|---|
| 3,737,701 | 6/1973 | Hoeberechts et al. | 357/49 |
| 3,979,765 | 9/1976 | Brand | 357/49 |
| 4,048,649 | 9/1977 | Bohn | 357/55 |

*Primary Examiner*—Edward J. Wojciechowicz
*Attorney, Agent, or Firm*—H. Christoffersen; D. S. Cohen; R. A. Hays

[57] ABSTRACT

A semiconductor mesa device having reduced leakage current comprises a moat substantially completely filled with a passivating material. A layer of conductive material overlies the passivating material and is spaced apart from the adjacent semiconductor material. Such a structure is particularly advantageous for use in low current devices.

6 Claims, 1 Drawing Figure

U.S. Patent  Oct. 24, 1978  4,122,483
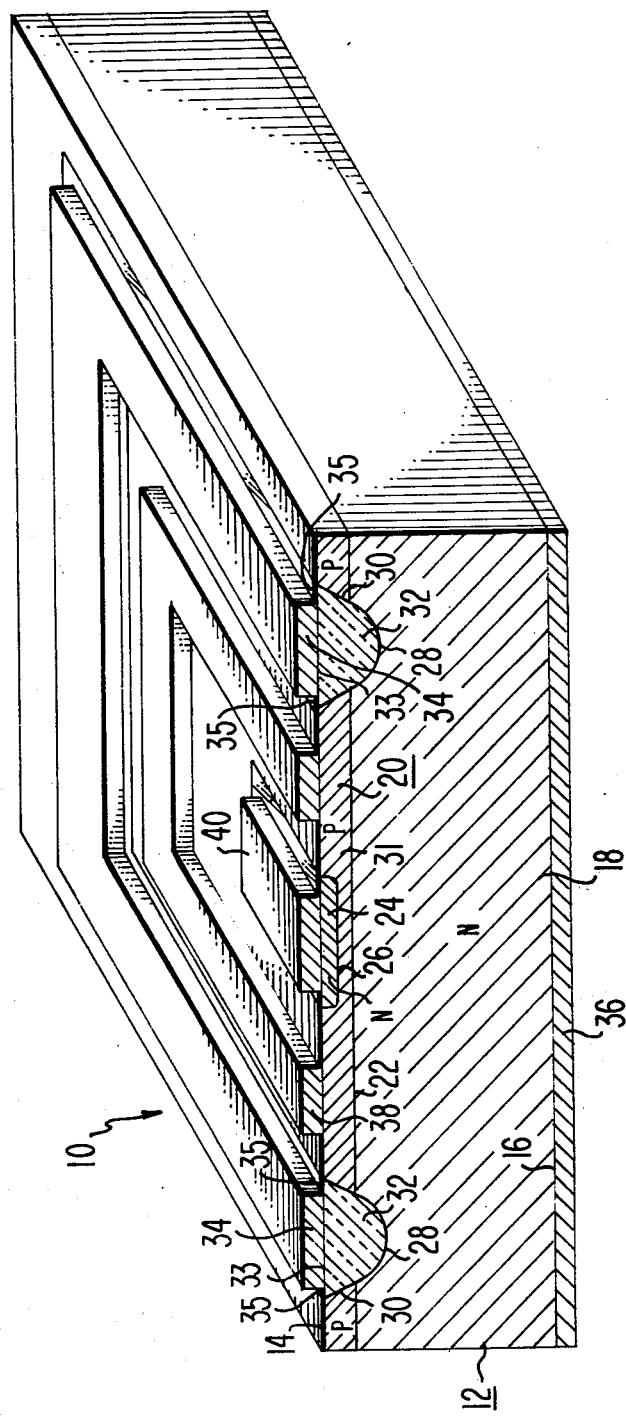

SEMICONDUCTOR DEVICE HAVING REDUCED LEAKAGE CURRENT

The present invention generally relates to semiconductor devices and, in particular, relates to semiconductor mesa devices.

Semiconductor mesa devices are usually characterized as having at least one PN junction terminating at a sidewall of a moat. The moat generally surrounds the device and is often refilled with a passivating material designed to reduce leakage current across the PN junction along its sidewall termination. However, the passivating material often has an excessive number of mobile ions along the surface thereof. As a result, many semiconductor mesa devices have a parasitic leakage current path across the surface of the passivating material. For a bipolar mesa transistor whose base-collector PN junction terminates at a sidewall of a moat, the parasitic leakage current reduces the base current during device operation. Such a loss of base current is particularly significant if the device is a transistor having a relatively low, i.e., about 10 microamps, operating current. Further, as with most parasitic effects, the leaksage current across the passivating material significantly increases at high temperatures, for example about 200° C.

From the above discussion it is clear that it is desirable, particularly for low current devices, to reduce or eliminate mobile ions on the surface of the passivating material. A device structure embodying the principles of the present invention has a reduced leakage current across the passivating material and improved operating characteristics, particularly at high temperatures.

The single figure of the drawing is a perspective view, partially in section, of a device, not drawn to scale, embodying the principles of the present invention.

A semiconductor device, indicated generally as 10 in the drawing, embodying the principles of the present invention, comprises a body 12 of semiconductor material having first and second major opposing surfaces 14 and 16, respectively. Preferably, the body 12 is monocrystalline silicon initially having an N-type conductivity, i.e., between from about 9Ω-cm to about 14Ω-cm, although the body 12 can also be P-type conductivity. It is understood by those in the semiconductor art that the plus (+) and minus (−) signs, when used in conjunction with a particular conductivity type designation, N or P, indicate a higher or lower, respectively, conductivity than a region designated as N or P without such a sign. For example, a region designated as N-type has a lower conductivity than a region designated as simply N type. In addition, while various regions are shown herein as having a given type conductivity, for example N type, it will be understood that the same region can be P type material so long as all other conductivity types designated are likewise changed.

A first region 18 is within the body 12 adjacent the second major surface 16. For exemplary purposes the first region 18 is considered to have an N+ type conductivity.

A second region 20 having a P type conductivity is within the body 12 adjacent the first major surface 14. The second region 20 extends into the body 12 and forms a first PN junction 22 with the first region 18 at the interface therebetween. The first PN junction 22 is substantially parallel to at least one of the major surfaces, 14 or 16. Preferably, the first and second major surfaces 14 and 16 respectively, are substantially parallel to each other. However, if they are not parallel, then the first PN junction 22 is preferably substantially parallel to the first major surface 14.

Although not necessary to the practice of this invention, the device 10 can also contain a third region 24 having an N+ type conductivity. The third region 24 is within the second region 20 and forms a second PN junction 26 at the interface therewith. Preferably, the second PN junction 26 extends to the first major surface 14.

A moat 28 having sidewalls 30 extends into the body 12 from the first surface 14. The moat 28 is laterally spaced apart from the third region 24 at the first surface 14 by material of the second region 29 and extends a distance into the body 12 such that the sidewall 30 at least intercepts the first PN junction 22. The moat 28 should form a closed perimeter, i.e., a square or circle or the like, around at least a portion 31 of the second region 20. Preferably, in this example, the moat 28 substantially completely surrounds the third region 24.

The moat 28, or at least the sidewall 30 thereof near the first PN junction 22 intercept therewith, is covered with a passivating material 32. Although most passivating materials known in the art can be used it is preferred that the passivating material 32 be a particulate type glass, for example, lead borosilicate glass, and substantially completely fill the moat 28 to form a surface 33. In cases where the moat 28 is substantially completely filled with passivating material 32, the surface 33 can appear as an extension of the first surface 14.

A layer 34 of metal, or other conductive material, overlies and contacts substantially all of the surface 33 of the passivating material 32. The layer 34 is spaced apart from the semiconductor material of the body 12 adjacent the moat 28. That is, if the surface 33 of the passivating material 32 is coplanar with the first surface 14 and the lateral width of the moat 28 at the surface 33 is on the order of about 0.013 cm, a rim 35 with a lateral width on the order of about 0.0025 cm of the passivating material 32 adjacent the portion 31 of the second region 20 should remain uncovered by the layer 34. As such, the layer 34 is electrically isolated from the remainder of the device 10 and only contacts the passivating material 32.

First, second and third electrode means, 36, 38 and 40 respectively, overlie and electrically contact to the first region 18, the second region 20 and the third region 24, respectively.

The device 10 described above can be fabricated by methods known in the semiconductor art. However, minor changes in mask structure are usually necessary. That is, after the various regions 18, 20 and 24, have been formed, a layer (not shown) of masking material, usually silicon dioxide or the like, is formed on the first surface 14. The masking layer is then defined, using known etching and photolithographic techniques, to provide openings through which the moat 28 is etched. After the moat 28 is formed and filled with passivating material 32, the layer of silicon dioxide is further defined to expose portions of at least the second and third regions, 20 and 24, respectively. A layer of conductive material (not shown) is then formed over the surface 14, the masking layer and the surface 33 of the passivating material. Ordinarily, a subsequent step in the fabrication would comprise defining the second and third electrode means 38 and 40 respectively, by removing, i.e., by etching, all of the remainder of the layer of conductive material from the masking layer and the surface 33 of passivating material 32. It is this removal of conductive material from the surface 33 of passivating material 32 which is believed to cause the presence of mobile ions on the surface 33. By designing a mask (not shown) to permit the layer 34 to remain on the surface 33 the presence of mobile ions thereon appears to be drastically reduced. Of course, the mask should be made to facilitate the creation of the rim 35 as discussed above. As a result, as further discussed below, during the operation of the device 10 only an insignificant number of mobile ions are available to enhance leakage current.

For operational purposes the device 10 can be considered a bipolar transistor having the first region 18 as a collector region, the second region 20 as a base region and the third region 24 as an emitter region. Accordingly, the first and second PN junction, 22 and 26, respectively, are the base-collector and base-emitter PN junctions, respectively.

During the on-state operation of the device 10, the base-collector PN junction is usually reverse biased. In such a state the device 10 is susceptible to various parasitic leakage current paths. One leakage path in particular is across the surface 33 of the passivating material. This loss of current, particularly in a low current device, is significant in and of itself but results can be severely limiting to the operation of the device if it is injected into the collector region. In such a case the safe operating voltage of the base-collector PN junction is considerably reduced. However, if the device 10 wherein there are only an insignificant number of mobile ions on the surface 33 and no direct path thereacross the leakage current is substantially reduced even at high operating temperatures where leakage current is usually the highest.

This leakage current reduction can also be explained using electric field theory since ion migration, which is one cause of the current leakage, usually follows electric field lines. The electric fields emanating from the reverse biased base-collector PN junction are equipotential in nature and, but for the layer 34 of metal over the passivating material 32, would generally emanate from and terminate on the semiconductor material of the body 12 and would surround most of the surface of the passivating material 32. However, the presence of the layer 34 of conductive material disrupts the shape of the field lines and causes many of them to terminate in the layer 34. Since, by utilizing a structure embodying the principles of the present invention, there are few, if any, equipotential lines extending completely across the layer 34, the ion migration which would ordinarily take place along a completed field line is no longer enhanced.

Hence, a device embodying the principles of the present invention exhibits substantially lower leakage current across the surface 33 of the passivating material 32 than a conventional device, even during high temperature operation thereof.

What is claimed is:

1. A bipolar semiconductor device comprising:
   a body of semiconductor material having first and second major surfaces, said first surface having a moat therein, said moat having a sidewall, said moat being substantially completely filled with passivating material;
   a first region having a one type conductivity adjacent said second surface and a second region having another type conductivity adjacent said first surface and said first region; said first and second regions defining a first PN junction at the interface therebetween, said first PN junction terminating at said sidewall;
   a layer of conductive material overlying and contacting only said passivating material in said moat, said layer being spaced apart from said second region by a rim of said passivating material.

2. A bipolar device as claimed in claim 1 wherein:
   said moat forms a closed perimeter around at least a portion of said second region.

3. A bipolar seniconductor device as claimed in claim 1 further comprising:
   a third region having said one type conductivity within said second region and forming a second PN junction at the interface therewith, said second PN junction terminating at said first surface.

4. A bipolar semiconductor device as claimed in claim 3 further comprising:
   first, second and third electrode means overlying and electrically contacting said first, second and third regions, respectively, said first, second and third electrode means being electrically isolated from said layer of conductive material.

5. A bipolar semiconductor device as claimed in claim 1 further comprising:
   first and second electrode means overlying and electrically contacting said first and second regions, respectively, said first and second electrode means being electrically isolated from said layer of conductive material.

6. A bipolar semiconductor device as claimed in claim 1 wherein:
   said moat has a lateral width of about 0.013 cm in the plane of said first surface; and
   said rim has a lateral width of about 0.0025 cm.

* * * * *

UNITED STATES PATENT AND TRADEMARK OFFICE
CERTIFICATE OF CORRECTION

PATENT NO. : 4,122,483

DATED : October 24, 1978

INVENTOR(S) : William Hulstrunk

It is certified that error appears in the above-identified patent and that said Letters Patent is hereby corrected as shown below:

Column 1, line 25:     "leaksage" should be--leakage--

Column 2, line 16:     "29" should be--20--

Column 4, line 29:     "seniconductor" should be--semiconductor--

Signed and Sealed this

Sixteenth Day of January 1979

[SEAL]

Attest:

RUTH C. MASON
Attesting Officer

DONALD W. BANNER
Commissioner of Patents and Trademarks